United States Patent [19]

Anjum et al.

[11] Patent Number: 5,360,749
[45] Date of Patent: Nov. 1, 1994

[54] METHOD OF MAKING SEMICONDUCTOR STRUCTURE WITH GERMANIUM IMPLANT FOR REDUCING SHORT CHANNEL EFFECTS AND SUBTHRESHOLD CURRENT NEAR THE SUBSTRATE SURFACE

[75] Inventors: Mohammed Anjum, Austin; Klaus H. Koop, Elgin; Maung H. Kyaw, Austin, all of Tex.

[73] Assignee: Advanced Micro Devices, Inc., Sunnyvale, Calif.

[21] Appl. No.: 166,305

[22] Filed: Dec. 10, 1993

[51] Int. Cl.$^5$ .................................. H01L 21/265
[52] U.S. Cl. ...................... 437/24; 437/35; 437/44
[58] Field of Search ............ 437/24, 26, 27–29, 437/35, 44, 45, 69

[56] References Cited

U.S. PATENT DOCUMENTS

| | | | |
|---|---|---|---|
| 4,835,112 | 5/1989 | Pfiester et al. | 437/24 |
| 5,108,954 | 4/1992 | Sandhu et al. | 437/200 |
| 5,250,455 | 10/1993 | Ohzone et al. | 437/43 |

FOREIGN PATENT DOCUMENTS

63-250812 10/1988 Japan.
4-251939 9/1992 Japan.

OTHER PUBLICATIONS

Wolf, S. "Silicon Processing for the VLSI Era", Lattice Press, Sunset Beach, CA. (1990) pp. 327–332 and 354–363.
Baker et al., "The Influence of Fluorine on Threshold Voltage Instabilities in P+ Polysilicon gated P-Channel MOSFETs", *IEDM*, (1989), pp. 443–446.
Yoon et al., "MOS Characteristics of NH$_3$-Nitrided N$_2$O-Grown Oxides", *IEEE*, (1993), pp. 179–181.
Sung et al., "A Comprehensive Study on p$^+$ Polysilicon-Gate MOSFET's Instability with Fluorine Incorporation", *IEEE*, (1990), pp. 2312–2320.
Lin et al., "The Effect of Fluorine on MOSFET Channel Length", *IEEE*, (1993), pp. 469–471.
Pfiester et al., "Improved MOSFET Short-Channel Device Using Germanium Implantation", *IEEE*, (1988), pp. 343–346.
Acovic et al., "Arsenic Source and Drain Implant Induced Degradation of Short-Channel Effects in NMOSFET's", *IEEE*, (1993), pp. 345–347.
Panteleev et al., "Influence of Elastic Stresses on Diffusion Processes in Semiconductors", *Sov. Phys. Solid State* 20(2), (Feb. 1978), pp. 324–325.
Sadana et al., "Enhanced Short-Channel Effects in NMOSFETs Due to Boron Redistribution Induced by Arsenic Source and DRain Implant", *IEDM*, (1992), pp. 849–852.
Wright et al., "The Effect of Fluorine in Silicon Dioxide Gate Dielectrics", *IEEE*, (1989), pp. 879–889.
Hsieh et al., "Characteristics of MOS Capacitor of BF$_2$ or B Implanted Polysilicon Gate with and without POCl$_3$ Co-doped", *IEEE*, (1993), pp. 222–224.
Ng et al., "Suppression of Hot-Carrier Degradation in Si MOSFET's by Germanium Doping", *IEEE*, (1990), pp. 45–47.

*Primary Examiner*—George Fourson
*Assistant Examiner*—David M. Mason
*Attorney, Agent, or Firm*—Kevin L. Daffer

[57] ABSTRACT

A semiconductor structure with germanium implant is provided for reducing V$_T$ shifts at the channel edges thereby minimizing short channel effects and subthreshold currents at or near the substrate surface. The semiconductor structure is adapted to receive non-perpendicular implant of germanium in the juncture between the channel and the source/drain regions as well as in the juncture between field oxide channel stop implant and source/drain regions. By carefully and controllably placing the germanium at select channel and field regions, segregation and redistribution of threshold adjust implant and channel stop implant dopant materials is substantially minimized. Reducing the redistribution of such materials provides a reduction in the short channel effects and, particularly, a reduction in substrate surface current or DIBL-induced current.

14 Claims, 2 Drawing Sheets

METHOD OF MAKING SEMICONDUCTOR STRUCTURE WITH GERMANIUM IMPLANT FOR REDUCING SHORT CHANNEL EFFECTS AND SUBTHRESHOLD CURRENT NEAR THE SUBSTRATE SURFACE

BACKGROUND OF THE INVENTION

1. Field of the Invention

This invention relates to integrated circuit manufacture and more particularly NMOS-type integrated circuits having fine-line geometries with threshold adjust and arsenic source/drain implants.

2. Background of the Relevant Art

Fabrication of an NMOS device generally begins with a p-type silicon substrate having a plurality of source/drain n-type regions implanted into the substrate or well. A channel region is formed within the substrate and between corresponding pairs of source/drain regions. A gate oxide and control polysilicon are formed above the channel in order to controllably activate an inversion area within the channel and between source and drain conductors. In FIG. 1, a top view of an active device 10 is shown having control polysilicon 12 placed above channel region 14, wherein channel 14 is configured between source and drain implants 16 and 18, respectively.

Very large scale integration (VLSI) processing dictates that active devices 10 be placed close to one another in a dense fashion. As such, source and drain regions 16 and 18 are implanted at a shallow depth, and are separated from one another by a short channel 14. The distance between source and drain regions is often referred to as the "physical channel length". However, after implantation and subsequent diffusion of the source and drains, the distance between the source and drain regions becomes less than the physical channel length, and is often referred to as the "effective channel length" (Leff).

Referring to a cross-sectional view along plane A—A of FIG. 1, FIG. 2 illustrates Leff as the distance between the inner diffusion boundaries of source and drain regions 16 and 18. As NMOS devices become more dense, Leff becomes extremely small. A well-known phenomena, denoted as "short channel effects" (SCE) generally arises whenever Leff becomes less than approximately 3 µm. SCE becomes a dominant part of MOS device behavior at small Leffs. Generally speaking, SCE impacts device operation by, inter alia, reducing device threshold voltages and increasing subthreshold currents. A problem related to SCE, however, altogether different, is the problem of "hot carrier effect" (HCE). HCE is a phenomena by which hot holes and electrons can overcome the potential energy barrier between the silicon and overlying silicon dioxide in order to cause hot carriers to inject into the gate oxide. HCE thereby relates to carrier impact at the substrate topography, whereas SCE relates to carrier impact within the substrate itself.

SCE is most pronounced by its affect upon threshold voltages. As Leff is reduced, measured value of threshold voltage of an NMOS enhancement-mode device becomes less positive, while threshold of an NMOS depletion-mode device becomes more negative. Hence, some of the channel region becomes partially depleted without any influence of a gate voltage. Since some of the channel is depleted absence gate bias, less gate charge is required to invert the channel in short-channel devices than in long-channel devices with comparable substrate doping. Another problem associated with SCE is the impact upon subthreshold currents. In short-channel devices, larger subthreshold current values are observed at lower voltages than in long-channel devices. Two of the primary causes of increased subthreshold current are: (i) punchthrough and (ii) drain-induced barrier lowering (DIBL). Punchthrough results from the widening of the drain depletion region when a reverse-biased voltage is placed on the drain. The electric field of the drain may eventually penetrate to the source area, thereby reducing the potential energy barrier of the source-to-body junction. Recent studies have indicated that in devices which use ion implantation to adjust threshold voltages, the barrier is lowest away from the silicon-silicon dioxide interface. As a result, punchthrough current flows below the surface region and deep within the substrate bulk material. Contrary to punchthrough current, DIBL-induced current occurs mostly at the substrate surface. Application of a drain voltage can cause the surface potential to be lowered, resulting in a lowered potential energy barrier at the surface and causing the subthreshold current in the channel near the silicon-silicon dioxide interface to be increased. This implies that subthreshold current at the surface due to DIBL is expected to become larger as the gate voltage approaches threshold.

As shown above, there are numerous effects resulting from SCE including, but not limited to, threshold, punchthrough and DIBL skews. Unlike SCE, HCE occurs above the substrate in the substrate topography and, more particularly, in the gate oxide. This is because the gate oxide normally contains empty electron states, also known as "traps", which can be filled by the injection of hot carriers. Due to the polarity of trapped charge, the resulting shift in the NMOS device threshold is positive. The result of HCE is therefore the same as SCE for threshold skew, but the means for achieving the deleterious result is altogether different. Further, HCE does not demonstrate bulk or surface-induced current such as punchthrough- and DIBL-induced current.

Due to their dissimilarities, different solutions are needed to overcome the problems of HCE and SCE. A popular processing methodology used to minimize HCE is to apply double-diffused drains or lightly-diffused drains (LDDs) in the active area between the source/drain regions and the channel area. The purpose of LDDs is to absorb a majority of the electron potential into the drain and thus reduce the maximum electric field therein. Illustrated in FIG. 2 are LDDs 20 implanted into the active area prior to placement of sidewall spacers 22 at the sides of polysilicon 12. The purpose and formation of sidewall spacers 22 are well known in the art. Generally speaking, spacers 22 allow subsequent implant of source and drain regions 16 and 18 spaced from the channel at a higher dose than LDDs 20. The lighter dose LDDs absorbs virtually the entire voltage drop between the drain (or source) and the channel. The electric field is thereby reduced, resulting in a lessening of the hot carriers being injected into the gate oxide 24. As described in Ng, et al., "Suppression of Hot-Carrier Degradation in Si MOSFET's by Germanium Doping", *Electron Device Letters*, Vol 11, No. 1, January, 1990, germanium co-implanted with the LDD areas further enhances the LDD structure. Germanium, being electrically neutral, is purposefully placed between the channel and the source/drain areas in order to minimize injection of "lucky" hot carriers in the gate oxide.

SCE, on the other hand, presents punchthrough (bulk) current path 26 and DIBL (surface) current path 28 from drain 18 to source 16, as shown in FIG. 2. In order to minimize punchthrough path 26, substantial research has focused upon using germanium co-implanted with source/drain phosphorous. See, e.g., Pfiester, et al., "Improved MOSFET Short Channel Device Using Germanium Implantation", *IEEE Electron Device Letters*, Vol 9, No 7, July, 1988. Germanium is therefore known as having an inhibiting effect upon phosphorous junction depths, thereby providing reduced punchthrough current in the bulk and thereby improving SCE. More recent studies with fluorine indicates the retardant effect of fluorine upon both the junction depth as well as the lateral diffusion of phosphorous. See, e.g., Lin, et al., "The Effect of Fluorine on MOSFET Channel Length", *IEEE Electron Device Letters*, Vol. 14, No. 10, October, 1993. Co-implant of fluorine with LDD regions limits the lateral diffusion of phosphorous source/drain regions and thereby affords a longer Leff.

Dissimilar from the problems of punchthrough current, DIBL-induced current 28 arises primarily from the operation of, or voltage placed upon, the drain region. A popular technique used to minimize DIBL current generally involves placing a threshold-adjust implant at the substrate surface in order to minimize current therethrough. Boron is often lightly implanted at the surface, as shown by reference numeral 30, in order not only to increase threshold voltages in channel 14, but also to offset the lowering of the surface potential naturally resulting from drain bias. As the gate voltage approaches threshold, subthreshold current at the surface due to DIBL will be lowered as a result of boron diffusion 30. Unfortunately, boron, being of opposite impurity type than either the LDD 20 or source/drain 16/18, allows migration of the electrically active boron dopant from the channel region to the adjacent LDDs or source/drain. The phenomena is often referred to as "boron redistribution and segregation". Many studies have evidenced this phenomena and have attributed its result to threshold rolloff and DIBL-induced current. See, e.g., Acovic, et al., "Arsenic Source and Drain Implant-Induced Degradation of Short-Channel Effects in NMOSFET's", *IEEE Electron Device Letters*, Vol. 14, No. 7, July, 1993.

As a result of recent studies, the advantages of boron implant 30 are offset by the demonstration of boron migration from the edges of channel 14 into the adjacent LDDs or source/drains during subsequent furnace or rapid thermal annealing. While arsenic provides higher conductivity at the source and drain, it also disrupts or damages the substrate lattice to a greater extent than older phosphorous source/drain implants. In order to remove the damage caused by arsenic implant, high temperature annealing at approximately 900° to 1000° C. is necessary. In the course of annealing, boron atoms 32, shown in FIG. 3 (i.e., FIG. 3 being a detailed view along area C of FIG. 2), migrate or diffuse (i.e., segregate) from the edges of channel 14 to LDD 20 and source/drain areas 16/18. The boron atoms can diffuse across substitutional (or vacant) sites or through interstitial movement. Due to a larger number of vacancies in regions 20, 18 and 16 caused by phosphorous atoms 33 (LDD implant) and arsenic atoms 34 (source/drain implant) intra-lattice disruption, vacancy and/or interstitialcy motion is greatly enhanced. Movement of boron atoms from the edge of channel 14 to adjacent implant areas along the substrate surface increases dramatically DIBL-induced currents and allows threshold rolloff. In order to counteract those problems, conventional solutions have pointed to applying additional boron "halo" implants around the source and drain to offset the boron redistribution void caused by anneal movement. See, e.g., Acovic, et al., "Arsenic Source and Drain Induced Degradation of Short-Channel Effects in NMOSFET's", *IEEE Electron Device Letters*, Vol. 14, No. 7, July, 1993; and Acovic, et al., "Enhanced Short-Channel Effects of NMOSFET's Due to Boron Redistribution Induced By Arsenic Source and Drain Implant", *IEDM*, 1992.

Placement of an electrically active dopant such as boron to offset the boron channel redistribution problem only adds to the threshold skewing problems of SCE. The purpose of threshold adjust implant is to specifically control and define consistent thresholds for each and every device across the semiconductor wafer. Indiscriminately implanting a boron halo at the channel edge may cause further increase of threshold beyond a desired amount in only a select few of devices but not all devices. Accordingly, tight control of threshold and consistent reduction of DIBL-induced current cannot necessarily be achieved by adding to or taking away from the threshold adjust boron, as it currently exists within the channel area. Still further, a boron implant into or around the source and drain regions adversely effects the source/drain junction capacitance thereby decreasing the operating ("on/off") speed of the device. While it is important to maintain arsenic as the preferred source/drain implant material, it is also important to control the problems of boron redistribution without adding additional electrically active dopants to the channel or within the arsenic areas.

It is also important to tightly control another phenomena known as narrow gate-width effect (NGWE) related to SCE but altogether different. NGWE refers to the encroachment of channel stop dopants such as boron under the field oxide edges at the sides of the gate. Referring to FIG. 4, a cross sectional view of the gate width along plane B—B of FIG. 1 is shown. Channel stop dopant 36 is shown placed across the upper surface of the substrate not only to adjust threshold voltages in the channel (as shown by reference numeral 30 of FIG. 2) but also to physically and electrically block lateral out-diffusion of source/drain implants underneath field oxide 38. As channel lengths become small, so do channel widths. A result being a greater likelihood of drain/source and/or channel voltages causing field-induced encroachment of dopants 36 into the adjacent channel or source/drain regions. Encroachment, shown by arrow 40 provides an even smaller channel width, i.e., a channel width, Wmod, which is less than the physical channel width, W.

SUMMARY OF THE INVENTION

Problems outlined above are in large part solved by the improved processing methodology of the present invention. That is, an electrically inactive or neutral implant is used to minimize or reduce boron redistribution from the channel edges to the source/drain regions. The impurity, such as germanium, can be used to provide such a result and to allow the advantages of highly conductive arsenic implant. By using an electrically inactive barrier material, additional threshold skews associated with boron halo implant are unnecessary. Depending upon the height of the polysilicon and the implant angle, varying amounts of electrically inactive implant is introduced at the edges beneath both the gate oxide and field oxide in order to provide a dual purpose of minimizing both SCE and NGWE. By implanting the electrically neutral material underneath the gate oxide and field oxide and within threshold adjust and channel stop boron, the implant minimizes boron redistribution from underneath the gate and field oxide areas to adjacent arsenic areas. Placement underneath the field oxide allows the neutral impurity to minimize encroachment of the channel-stop dopants underneath the edges of the field oxide into the source/drain areas. Electrically neutral implant not only allows the advantages of arsenic in the source and drains, but also maintains status quo of boron in both the channel area as well as the channel stop.

Electrically neutral implant can be placed at a later stage of circuit development in order to minimize the number of thermal cycles occurring after implant. In particular, the neutral implant occurs at a non-perpendicular angle relative to the substrate and after polysilicon, gate and field oxide formation in order to ensure it is placed in the surface areas slightly underneath the gate and field oxides. The neutral implant is thereby purposefully directed in the juncture areas at the surface edges of the channel and channel stops in order to particularly minimize DIBL-type subthreshold currents (i.e., reduce threshold voltage shifts at the channel edges), and to minimize encroachment of channel stop dopant (i.e., minimize NGWE).

Broadly speaking, the present invention contemplates a method for producing a NMOS device having reduced DIBL-induced currents. The method comprises the steps of placing boron into a surface region of a p-type substrate, growing a field oxide upon the substrate, and then growing a gate oxide and patterning a polysilicon gate over the gate oxide. The polysilicon gate is patterned a lateral spaced distance from the field oxide in order to implant phosphorous into the substrate and within the lateral spaced distance. The phosphorous is implanted to a concentration peak density at a first depth relative to the upper surface of the substrate. Next, an electrically neutral impurity is implanted at a non-perpendicular angle relative to the substrate. The electrically neutral impurity is implanted into a channel region underlying a portion of the gate oxide and into a field region underlying a portion of the field oxide. Arsenic can then be implanted into the substrate and within the lateral spaced distance to a concentration peak density at a second depth relative to the upper surface of the substrate. The second depth is greater than the first depth, and the boron comprises a threshold adjust implant placed at a concentration peak density depth less than the first and second depths. Alternatively, the electrically neutral impurity is implanted at a concentration peak density depth substantially equal to the first depth.

During subsequent thermal cycles, the electrically neutral impurity minimizes or reduces the boron segregation and diffusion from the channel regions and from the field regions. The electrically neutral impurity is preferably germanium, and the step for implanting germanium comprises ionizing elemental germanium and accelerating the germanium ions at a dose in the low $1 \times 10^{12}$ atoms/cm$^2$ range and at an implant energy slightly less than 60 keV, whereby the concentration peak density of the germanium atoms is at a depth equal to or less than the LDD implant. All of the above parameters can vary depending upon process constraints. Dosage, energy, and depth of implant vary depending upon implant angle.

The present invention further contemplates a method for reducing the diffusion of boron from a channel region and from a field oxide region to adjacent source and drain regions within a semiconductor substrate. The method comprises the steps of providing boron into a channel region and a field oxide region. The channel region resides within a substrate below a patterned polysilicon gate and a gate oxide, whereas the field oxide region is laterally spaced from the channel region and resides within the substrate below a patterned field oxide. Germanium is then implanted into a portion of the channel region at a non-perpendicular angle relative to the substrate, wherein a majority of the germanium resides at or less than the LDD implant (e.g., 700–800 Å) below the surface of the substrate and between a middle portion of the channel region and subsequently placed source and drain regions. Germanium is simultaneously implanted into the field oxide regions at a non-perpendicular angle relative to the substrate, wherein a majority of the germanium resides at or less than the LDD implant (e.g., 700–800 Å) below the surface of the substrate and between the patterned field oxide and the subsequently placed source and drain regions. The germanium occupies a plurality of diffusion sites necessary to reduce diffusion and segregation of boron from the channel region or from the field oxide region during a subsequent thermal annealing step.

BRIEF DESCRIPTION OF THE DRAWINGS

Other objects and advantages of the invention will become apparent upon reading the following detailed description and upon reference to accompanying drawings in which.

Figure 1:
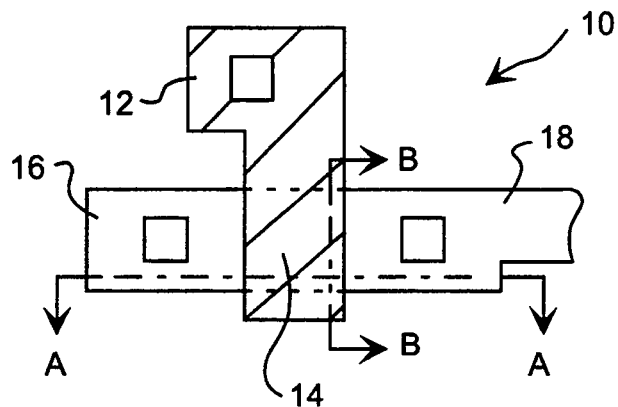
FIG. 1 is a top view of a semiconductor device layout.
Figure 2:
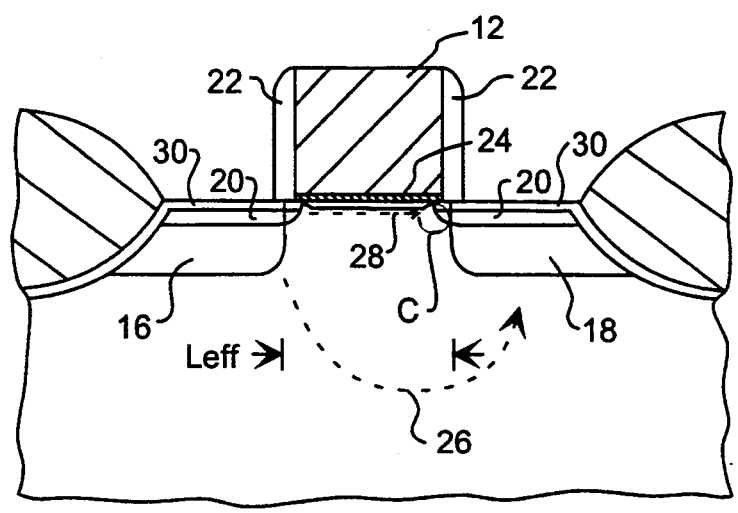
FIG. 2 is a cross-sectional view along plane A—A of FIG. 1, showing a semiconductor device formed according to a prior process methodology.
Figure 3:
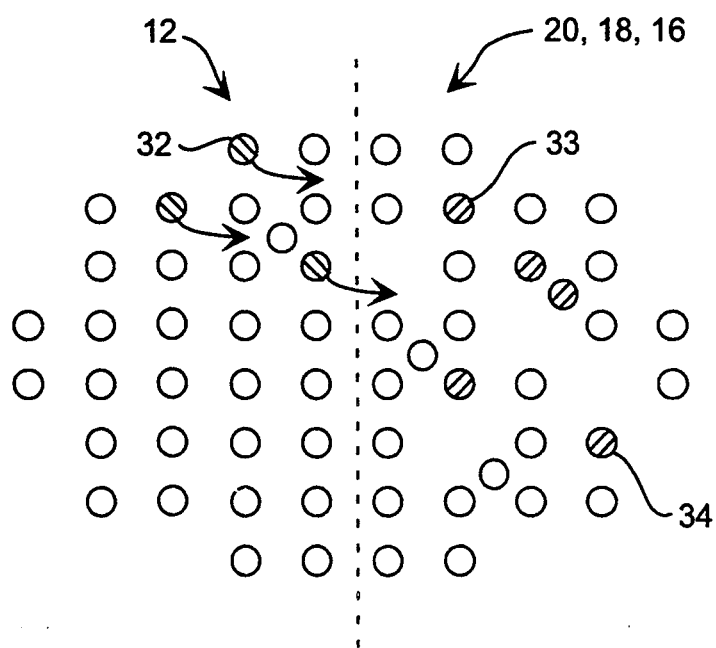
FIG. 3 is an atomic view along area C of FIG. 2, showing the substrate lattice structure at the channel-source/drain interface resulting from a prior process methodology.
Figure 4:
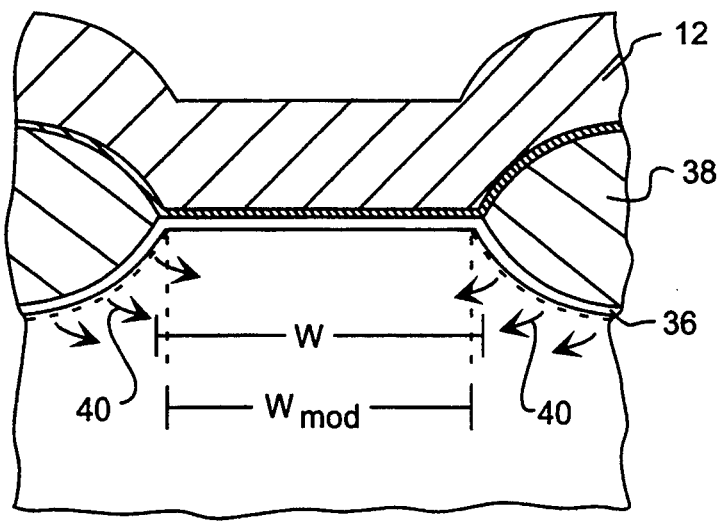
FIG. 4 is a cross-sectional view along plane B—B of FIG. 1, showing a semiconductor device formed according to a prior process methodology.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 5:
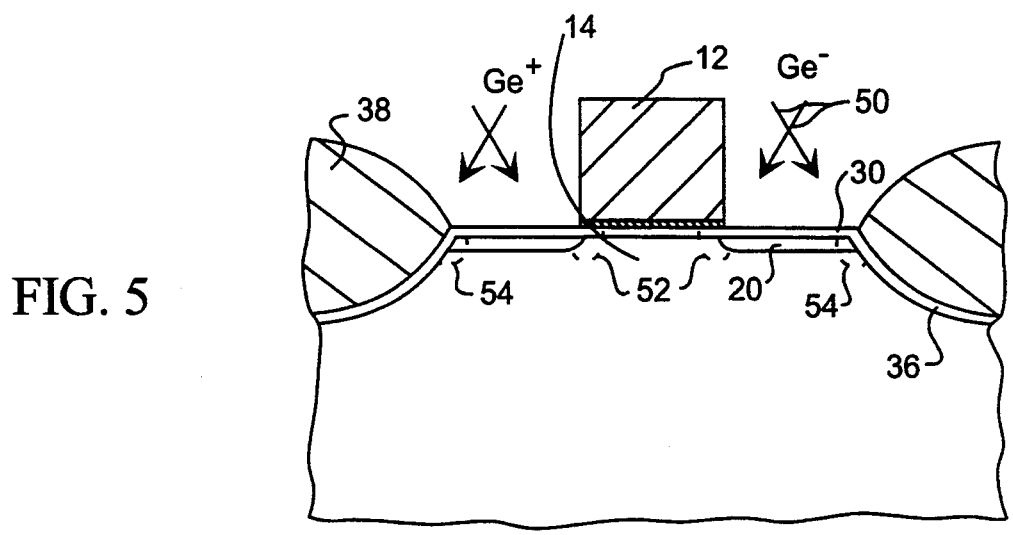
FIG. 5 is a cross-sectional view along plane A—A of FIG. 1, showing a semiconductor device formed according to a processing steps of the present invention.

Turning now to FIG. 5, a cross-sectional view along plane A—A of FIG. 1 is illustrated. In particular, an electrically neutral impurity such as germanium is implanted at a non-perpendicular angle shown by reference numeral 50. Germanium 50 is implanted after field oxide 38, gate oxide 24, polysilicon 12, threshold adjust/channel stop dopant 30/36 and LDDs 20 are formed. Germanium is preferrably implanted during LDD implant, therefore, fewer segregates are allowed to form due to fewer thermal cycles occurring before Ge/LDD implant. By experiencing fewer thermal cycles, Ge remains at a more stable location within the underlying substrate lattice. Germanium 50 is placed at implant sites within the substrate, referenced by channel regions 52 and field oxide regions 54. Channel regions 52 exist at the edges of channel region 14 (i.e., between the middle of channel region 14 and LDDs 20). Preferably, channel regions 52 extends several tenths of a micron inside the outer edge of polysilicon 12 and gate oxide 24. Of course, the amount of extension of regions 52 into channel region 14 depends upon the angle of implant 50. However, a 0.2 $\mu$m to 0.4 $\mu$m implant inside the outer edge is a preferred range which provides a suitable barrier between the boron of threshold implant 30 and LDDs 20.

Germanium, being electrically neutral, physically plugs or occupies intra-lattice diffusion sites at the channel-source/drain interface. Germanium atoms, being of large atomic mass, help scatter any mobile boron which might redistribute along the surface of the substrate. Furthermore, it is speculated that the added scattering effect may also be due to the disturbance of the band structure at the interface since the Si-Ge bond has a smaller energy bandgap than only Si. By utilizing the scattering effect and the small energy bandgap of the resulting structure, germanium is used to increase the mean-free path to a value larger than that seen by the majority of the channel carriers in order to lessen the likelihood of carrier (boron) movement along the surface path. Accordingly DIBL-induced current is substantially lessened as a result of germanium placed at channel regions 52.

Still further, germanium placed at field oxide regions 54 helps minimize NGWE at the field oxide/active area interface. Similar to germanium in regions 52, germanium at the field oxide interface prevents movement of mobile carriers, such as boron, from threshold adjust dopant 30 to LDDs 20 and/or from channel stop dopant 36 to subsequently placed source/drain regions. By using a non-perpendicular implant angle, germanium is placed slightly below the inside edge of field oxide 38 so as to extend beyond the channel stop edge of LDDs 20. Thus, region 54 occupies the entire interface between LDDs 20 and dopant area 36.

Figure 6:
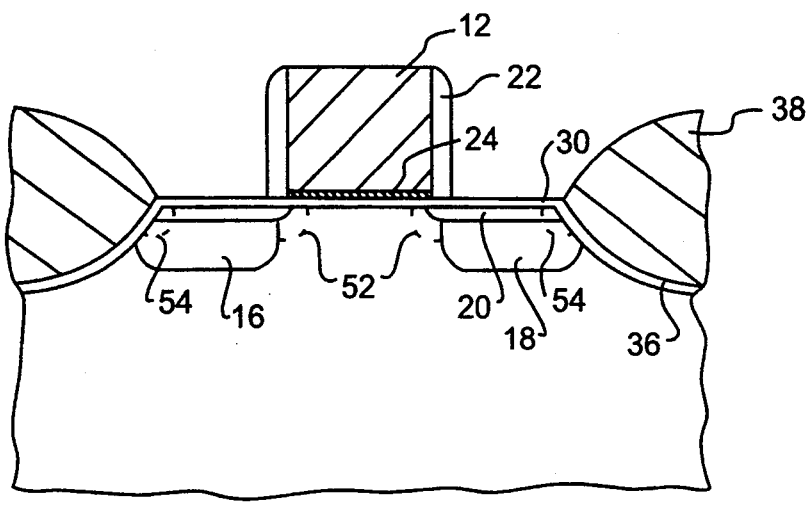
FIG. 6 is a cross-sectional view along plane A—A of FIG. 1, showing a semiconductor device formed according to further processing steps of the present invention.

Referring now to FIG. 6, subsequent processing steps are shown along cross-sectional plane A—A of FIG. 1. Namely, a spacer 22 is formed on the sides of polysilicon 12 and gate oxide 24 to allow implant of source and drain regions 16 and 18. Source and drain regions are implanted at a heavier dose arsenic than the lighter doped phosphorous LDDs. Source and drain regions are thereby implanted at a deeper depth than both the LDDs and germanium implant areas. Germanium regions 52 and 54 are preferably placed at a concentration peak density depth equal to or less than the concentration peak density depth of the LDDs. Accordingly, LDDs concentration peak density is at a first depth and source/drain concentration peak density is at a second depth, wherein the first depth is shallower than the second depth.

It is important to note that implantation of a germanium barrier in accordance with the present invention substantially reduces subthreshold currents and, more particularly, reduces DIBL-induced currents by reducing $V_T$ shifts at the edges of the channel in the substrate surface. Germanium implant therefore minimizes SCE, however, is not necessarily used as a solution to other problems such as HCE, or punchthrough currents associated with SCE. Moreover, germanium implant not only reduces DIBL-induced current but also minimizes NGWE at the field oxide interface.

It will be appreciated to those skilled in the art having the benefit of this disclosure that this invention is capable of applications with numerous types of NMOS-processed circuits. Furthermore, it is to be understood that the form of the invention shown and described is to be taken as a presently preferred embodiment. Various modifications and changes may be made to each and every processing step as would be obvious to a person skilled in the art. Germanium implant at a non-perpendicular angle at various interface regions of the active area can occur in the presence of or absence of a sidewall spacer and/or LDDs. Thus, LDD technology is not required in order to carry forth the germanium implant and advantages thereof. It is intended that the following claims be interpreted to embrace all such modifications and changes and, accordingly, the specifications and drawings are to be regarded in an illustrative rather than a restrictive sense.

What is claimed is:

1. A method for producing an NMOS device having reduced Drain Induced Barrier Lowering (DIBL) induced currents of short channel effects, the method comprising the steps of:

placing boron into a surface region of a p-type substrate;

growing a field oxide above said surface region upon said substrate;

growing a gate oxide and patterning a polysilicon gate over said gate oxide a lateral spaced distance from said field oxide;

implanting phosphorous into said substrate and within said lateral spaced distance to a concentration peak density at a first depth relative to the upper surface of said substrate;

implanting at a non-perpendicular angle relative to said substrate at least one electrically neutral impurity into a channel region underlying a portion of said gate oxide and into a field region underlying a portion of said field oxide; and implanting arsenic into said substrate and within said lateral spaced distance to a concentration peak density at a second depth relative to the upper surface of said substrate, wherein said second depth is greater than said first depth.

2. The method as recited in claim 1, wherein said electrically neutral impurity comprises germanium.

3. The method as recited in claim 1, wherein said channel region comprises an area beneath said gate oxide and underlying the outer edge of said polysilicon gate and laterally inside said implanted phosphorous.

4. The method as recited in claim 1, wherein said field region comprises an area beneath said field oxide and laterally outside said implanted phosphorous.

5. The method as recited in claim 1, wherein said electrically neutral impurity is implanted at a concentration peak density depth substantially equal to said first depth.

6. The method as recited in claim 1, wherein said electrically neutral impurity is implanted at a concentration peak density depth less than said first depth.

7. The method as recited in claim 1, further comprising the step of annealing said substrate subsequent to said arsenic implanting step, wherein said electrically neutral impurity minimizes during said annealing step said boron diffusion from said channel and field regions to said arsenic implanted region.

8. The method as recited in claim 1, wherein said step for implanting an electrically neutral impurity comprises further steps of:
   ionizing elemental impurity species; and
   accelerating the ions at a dose less than $1 \times 10^{12}$ atoms/cm$^2$ at an implant energy less than approximately 60 keV, whereby the concentration peak density of the impurity atoms is at a depth approximately equal to 700–800 Angstroms.

9. A method for reducing diffusion and segregation of boron from a channel region and from a field region to adjacent source and drain regions within a semiconductor substrate, the method comprising the steps of:
   providing boron into a field region, wherein the field region resides within a substrate below a patterned field oxide;
   providing boron into a channel region laterally spaced from said field region, wherein said channel region resides within said substrate below a patterned polysilicon gate and a gate oxide;
   implanting germanium into a portion of said channel region at a non-perpendicular angle relative to said substrate, wherein a majority of the germanium resides less than 800 Angstroms below the surface of said substrate and between a middle portion of said channel region and subsequently placed source and drain regions, wherein said source and drain regions are placed between the channel region and the field region, whereby said germanium occupies a plurality of diffusion sites to reduce diffusion of boron from said channel region during a subsequent thermal annealing step; and
   simultaneously implanting germanium into said field region at a non-perpendicular angle relative to said substrate, wherein a majority of the germanium resides less than 800 Angstroms below the surface of said substrate and between said patterned field oxide and said subsequently placed source and drain regions, whereby said germanium occupies a plurality of diffusion sites to reduce diffusion of boron from said field region during a subsequent thermal annealing step.

10. The method as recited in claim 9, wherein said boron comprises a threshold adjust implant placed at a concentration peak density depth which is less than a concentration peak density depth of said source and drain regions.

11. The method as recited in claim 9, wherein said germanium is implanted at a concentration peak density depth substantially equal to a concentration peak density depth of said boron.

12. The method as recited in claim 9, wherein said germanium is implanted at a concentration peak density depth less than a concentration peak density depth of said source and drain regions.

13. The method as recited in claim 9, wherein said step for implanting germanium comprises further steps of:
   ionizing elemental germanium; and
   accelerating the germanium ions at a dose less than $1 \times 10^{12}$ atoms/cm$^2$ at an implant energy less than approximately 60 keV, whereby the concentration peak density of germanium atoms is at a depth approximately equal to 700–800 Angstroms.

14. A method for reducing diffusion and segregation of boron from a channel region and from a field region to adjacent source and drain regions in order to reduce Drain Induced Barrier Lowering (DIBL) induced currents of channel effects associated with boron diffusion and segregation from the channel and field regions, the method comprising the steps of:
   providing boron into a field region, wherein the field region resides within a substrate below a patterned field oxide;
   providing boron into a channel region laterally spaced from said field region, wherein said channel region resides within said substrate below a patterned polysilicon gate and a gate oxide;
   ionizing elemental germanium and accelerating a first portion of the germanium ions at a does less than $1 \times 10^{12}$ atoms/cm$^2$ at an implant energy of approximately 60 keV such that the concentration peak density of germanium atoms is implanted at a non-perpendicular angle into a portion of said channel region at a depth approximately equal to 700–800 Angstroms, wherein a majority of the germanium resides between a middle portion of said channel region and subsequently placed source and drain regions, wherein said source and drain regions are placed between the channel region and the field region, whereby said germanium occupies a plurality of diffusion sites to reduce diffusion of boron from said channel region during a subsequent thermal annealing step; and
   simultaneously implanting a second portion of the germanium ions at a dose less than $1 \times 10^{12}$ atoms/cm$^2$ at an implant energy of approximately 60 keV such that the concentration peak density of germanium atoms is implanted at a non-perpendicular angle into a portion of said field region at a depth approximately equal to 700–800 Angstroms, wherein a majority of the germanium resides between said patterned field region and said subsequently placed source and drain regions, whereby said germanium occupies a plurality of diffusion sites to reduce diffusion of boron from said field region during a subsequent thermal annealing step.

* * * * *